United States Patent [19]

Yamada et al.

[11] Patent Number: 5,023,615

[45] Date of Patent: Jun. 11, 1991

[54] LARGE SCALE INTEGRATED CIRCUIT FOR CONVERTING PULSE CODE MODULATED DATA TO AN ANALOG SIGNAL

[75] Inventors: Takaaki Yamada; Kazutoshi Shimizume, both of Kanagawa, Japan

[73] Assignee: Sony Corporation, Tokyo, Japan

[21] Appl. No.: 482,085

[22] Filed: Feb. 20, 1990

[30] Foreign Application Priority Data

Feb. 21, 1989 [JP] Japan ............................. 1-19129[U]
Feb. 22, 1989 [JP] Japan ............................. 1-42578[U]

[51] Int. Cl.$^5$ .......................................... H03M 1/82
[52] U.S. Cl. ................................. 341/152; 341/144; 375/22
[58] Field of Search ............... 341/144, 145, 146, 154, 341/119, 136, 118; 307/313, 491, 576, 579; 375/22; 381/152

[56] References Cited

U.S. PATENT DOCUMENTS 4,310,831 1/1982 Henderson et al. ............... 341/152
4,800,365 1/1989 White et al. ....................... 341/119
4,868,572 9/1989 Reiber ............................... 341/145

*Primary Examiner*—A. D. Pellinen
*Assistant Examiner*—Brian K. Young
*Attorney, Agent, or Firm*—Alvin Sinderbrand; William S. Frommer

[57] ABSTRACT

In a digital-to-analog converter for converting a received digital signal having N bits and a sampling frequency fs to an analog signal; digital interpolation filter receives the digital signal and generates a modified digital signal having a number of bits less than N and a sampling frequency greater than fs, pulse width modulator receives the modified digital signal and generates a pulse signal having pulse widths which correspond to the modified digital signal, output buffer having a complementary metal oxide semiconductor (CMOS) inverter circuit including P channel and N channel transistors having respective resistance values receives the pulse signal and low-pass filter receives the output signal from the output buffer, wherein the digital interpolation filter, the pulse width modulator and the output buffer are formed in an integrated circuit, and when the transistors are conductive the resistance values of the P channel and N channel transistors are set equal to each other by adjusting a voltage applied to the integrated circuit substrate so as to improve the signal-to-noise ratio of the produced analog signal.

4 Claims, 4 Drawing Sheets

FIG. 1
PRIOR ART
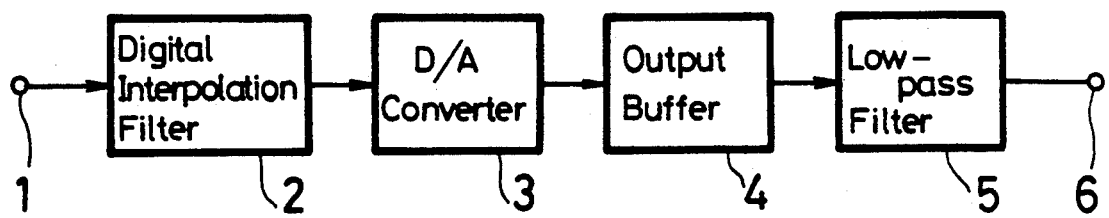
FIG. 2
PRIOR ART
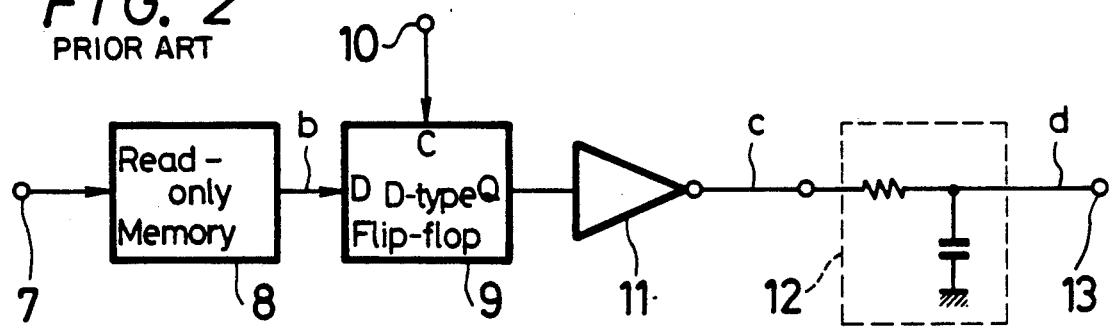
FIG. 3A PRIOR ART — Digital Input Signal
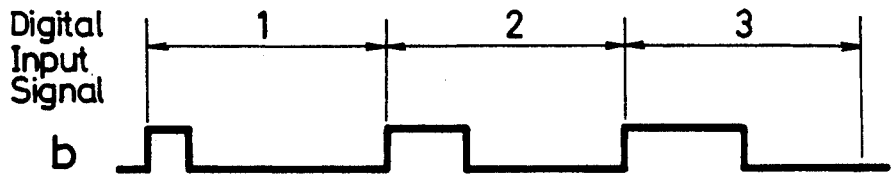
FIG. 3B PRIOR ART — b
FIG. 3C PRIOR ART — c
FIG. 3D PRIOR ART — d

LARGE SCALE INTEGRATED CIRCUIT FOR CONVERTING PULSE CODE MODULATED DATA TO AN ANALOG SIGNAL

BACKGROUND OF THE INVENTION

1. Field of the Invention

This invention relates generally to a large scale integrated (LSI) circuit and, more particularly in directed to an LSI circuit for converting pulse code modulated (PCM) data to an analog signal.

2. Description of the Prior Art

When a digital audio signal recorded on a record medium, such as a compact disc or the like, is converted to an analog audio signal, a digital-to-analog converter (hereinafter, referred to as a D/A converter) is used therefor. In the conventional D/A. converter, a digital audio signal of a predetermined bit number is converted to a staircase signal by code-to-voltage converting means and the thus converted staircase signal is supplied to a low-pass filter so as to produce an analog audio signal.

In the staircase signal converted by the code-to-voltage converting means a noise or a glitch occurs as a perturbation in the pulse waveform having a relatively short duration between respective staircases. Further, noise occurs due to the conversion accuracy of the converting means, so that, the sound quality of the resultant converted analog audio signal is deteriorated.

More specifically, in a weighting circuit used in the D/A converter, the following problems arise:

(1) An output voltage is determined by either a voltage-dividing ratio of a resistance/capacitance of an addition of currents. Thus, a fluctuation of the ratio between the resistance and the capacitance leads directly to a fluctuation of the output voltage. Typically, the fluctuation of the ratio between the resistance and the capacitance in an LSI circuit, that is, due to the manufacturing process, is within a range of approximately 0.1 to 1.0% which results in a maximum accuracy of the D/A converter of 10 to 14 bits. As a result, a trimming process is generally performed on the elements However, in order to perform the D/A conversion with an accuracy of 16 bits, a highly accurate trimming technique is required which cannot be easily performed; and (2) The glitch occurs due to the opening and closing timings of the latch circuits and the switching circuits being shifted, and is generally removed by a so-called deglitcher circuit. However, the tone quality is deteriorated by the switching noise of the deglitcher circuit or by a droop, a distortion, an overshoot and the like.

In an attempt to eliminate the defects encountered with the conventional D/A converter, numerous combined systems involving a noise shaping method and a one-bit D/A converting method have been recently developed.

Examples of the above-described combined systems include a Δ-to-Σ converting system developed by the Philips Corp., and a multi-stage noise shaping (MASH) system developed by the Nippon Telegram and Telephone Corporation. An overall arrangement of such a combined system is illustrated in the block diagram of FIG. 1.

As shown in FIG. 1, a digital audio signal, for example, of 16 bits, having a sampling rate fs is applied through an input terminal 1 to a digital interpolation filter 2, in which the signal is converted to a noise-shaped digital signal having 1 to 4 bits and a sampling rate of 32 to 256 fs. The resultant digital signal is supplied to a D/A converter 3 in which an analog signal is produced and outputted having an accuracy of 1 to 4 bits. The outputted analog signal is further processed by an output buffer 4 and a low-pass filter 5; whereupon, an analog audio signal is delivered to an output terminal 6.

In the D/A conversion of the noise shaping system, a shaping operation is performed for distributing a noise component in the high frequency region so as to produce an analog output with an improved signal-to-noise (S/N) ratio. Further, the D/A conversion of one bit is performed without the aforementioned defects, that is, the occurrence of glitches and the deterioration of the accuracy.

Systems have been proposed for the digital-to-analog conversion of pulse width modulation (PWM) signals in which a binary digital signal having 1 to 4 bits is processed so as to obtain a multi-level analog signal.

An overall arrangement of the D/A conversion in the noise-shaping system will be explained with reference to FIGS. 2 and 3A-3D.

As shown in FIG. 2, a noise-shaped digital signal, for example, of 3 bits, is supplied through an input terminal 7 to a read-only memory (ROM) 8 which outputs a pulse b which is pulse-width-modulated in the time direction. The waveform of the pulse b is represented in FIG. 3B. The output pulse b from ROM 8 is supplied to a D-type flip-flop circuit 9, in which the pulse is sampled by a clock signal, which is applied to an input terminal 10 from a crystal oscillation clock (not shown), so as to absorb jitter components.

The output signal from D-type flip-flop 9 is supplied through a complementary metal oxide semiconductor (CMOS) converter 11 to a low-pass filter 12 from which an analog output signal is coupled to an output terminal 13.

An operation of the circuit arrangement of FIG. 2 will now be described for the case in which the digital signal applied to the input terminal 7 changes levels as at "1", "2", "3" in FIG. 3A.

The noise-shaped digital signal supplied through input terminal 7 to the ROM 8 causes the latter to output the pulse signal b having a pulse width proportional to the digital values as shown in FIG. 3B. The pulse b is sampled by the D-type flip-flop 9 and the output sampled signal is supplied to CMOS inverter 11 which derives a pulse c having a predetermined phase relative to the pulse b, as represented in FIG. 3C. The pulse c is smoothed by the low-pass filter 12, and is supplied to output terminal 13 as an output signal d have a gradually increasing voltage level as shown by the waveform diagram of FIG. 3D.

The output c, from CMOS inverter 11, is a voltage signal in binary form which represents the GND and $+V_{DD}$ value, so that, although the aforementioned D/A converter produces a multi-value analog output, this D/A converter is generally regarded as a one-bit D/A converter. Accordingly, the prior-art weighting circuit, as previously described, is not required, so that, D/A conversion can be performed which is free from the problems of accuracy deterioration and the occurrence of glitches.

In the D/A converter of the pulse width modulation system for generating the PWM wave, an output buffer circuit must be provided as the final stage circuit which is, for example, composed of two field effect transistors (FETs) 21 and 22 as shown in FIG. 4. The PWM wave, from the converting circuit, is supplied to a terminal 23 which is connected to the gate electrodes of the two field effect transistors 21 and 22. The source electrode of the P-channel field effect transistor 21 is connected to a voltage source terminal $V_{DD}$, whereas the source electrode of the other or N-channel field effect transistor 22 is connected to a voltage source terminal $V_{SS}$. The drain electrodes of the two field effect transistors 21 and 22 are connected together and coupled to a common output terminal 24. Thus, the PWM wave is supplied through the output buffer circuit to output terminal 24.

In the previously described output buffer circuit, the ON resistance values of P-channel and N-channel transistors 21 and 22, respectively, must be made equal to each other, so as not to deteriorate the signal-to-noise (S/N) ratio of the output signal. For example, when the ON resistance values of the P-channel and N-channel transistors 21 and 22, respectively, are equal to each other, the S/N ratio of the audio signal delivered from the D/A converter is higher than 120 dB, which results in a high quality audio signal. On the other hand, if the ON resistance values of the P-channel and N-channel transistors 21 and 22, respectively, are not equal to each other, the S/N ratio of the audio signal is only approximately 80-100 dB. In an attempt to avoid this defect, it has been proposed to insert a resistor between the source electrode, for example, between the P-channel transistor 21 and the voltage source terminal $V_{DD}$, for adjusting the ON resistance values. However, the ON resistance values fluctuate due to changes in ambient temperature. For example, as shown in FIG. 5, if the ambient temperature is changed by 50° C., this is, from 25° C. to 75° C., the ON resistance value is changed from 10Ω to 11Ω, that is, by about 10%. Thus, since the ON resistance values fluctuate due to temperature change adjusting the ON resistance values at a particular ambient temperature by the means of resistor. Does not insure that the ON resistance values will remain equal at other ambient temperatures.

In the circuit arrangement shown in FIG. 2, the output PWM pulse from ROM 8 can be regarded as an analog-converted signal. Thus, the D-type flip-flop 9, the inverter 11 and the circuits succeeding the output of the ROM 8, can be regarded as an analog signal processing portion. On the other hand, the ROM 8 and the digital interpolation filter 2 (FIG. 1) constitute a digital signal processing portion and these digital elements can be readily formed on a single LSI chip.

When a plurality of signal processing portions are formed on the same chip, it is frequently observed that one signal processing portion exerts a negative influence on the other signal processing portion. More specifically, when, for example, the digital signal processing portion and the analog signal processing portion are formed on the same chip, a signal in the form of a pulse wave, which is processed by the digital signal processing portion, exerts a negative influence upon a signal within the analog signal processing portion, so as to superimpose a noise component upon an output signal of the analog signal processing portion.

OBJECTS AND SUMMARY OF THE INVENTION

Accordingly, it is an object of the present invention to provide a digital-to-analog (D/A) converter which avoids the above-mentioned disadvantages of the prior art.

More specifically, it is an object of the present invention to provide an improved D/A converter for generating a pulse-width-modulated output signal with an improved signal-to-noise (S/N) ratio by adjusting an ON resistance value of an output buffer circuit.

It is another object of the present invention to provide an improved D/A converter formed on a single integrated circuit chip in which a signal in the analog signal is not influenced by a signal in the digital signal processing portion.

According to an aspect of the present invention, in a digital-to-analog converter for converting a received digital signal having N bits and a sampling frequency fs to an analog signal with an improved signal-to-noise ratio and which comprises digital interpolation filter means for receiving the digital signal and generating a modified digital signal having a number of bits less than N and a sampling frequency greater than fs, pulse width modulator means for receiving the modified digital signal and generating a pulse signal having pulse widths which correspond to the modified digital signal, output buffer means for receiving the pulse signal and having a complementary metal oxide semiconductor (CMOS) inverter circuit including P channel and N channel transistors having respective resistance values, and low-pass filter means for receiving an output signal from said output buffer means; the digital interpolation filter means, the pulse width modulator means and the output buffer means are formed in an integrated circuit which includes a substrate and means for receiving a variable supplied voltage through said substrate, and said supplied voltage is adjusted so that, when the transistors are conductive, the resistance values of the P channel and N channel transistors are equal to each other so as to improve the signal-to-noise ratio of the produced analog signal.

The above, and other objects, features and advantages of the present invention, will be apparent in the following detailed description of preferred embodiments of the invention when read in conjunction with the accompanying drawings in which corresponding parts are identified by the same reference numerals.

BRIEF DESCRIPTION OF THE DRAWINGS

FIG. 1 is a block diagram schematically illustrating a noise-shaping one bit digital-to-analog converter to which the present invention can be advantageously applied;

FIG. 2 is a block diagram schematically illustrating a pulse-width-modulation type digital-to-analog converter which produces a multi-level analog output;

FIGS. 3A to 3D are waveform diagrams to which reference will be made in explaining the operation of the digital-to-analog converter of FIG. 2;

DETAILED DESCRIPTION OF PREFERRED EMBODIMENTS

A pulse-width-modulated output circuit used in an improved digital-to-analog converter according to an embodiment of the present invention will now be explained in detail with reference to FIGS. 6, 7 and 8A-8C.

Figure 6:
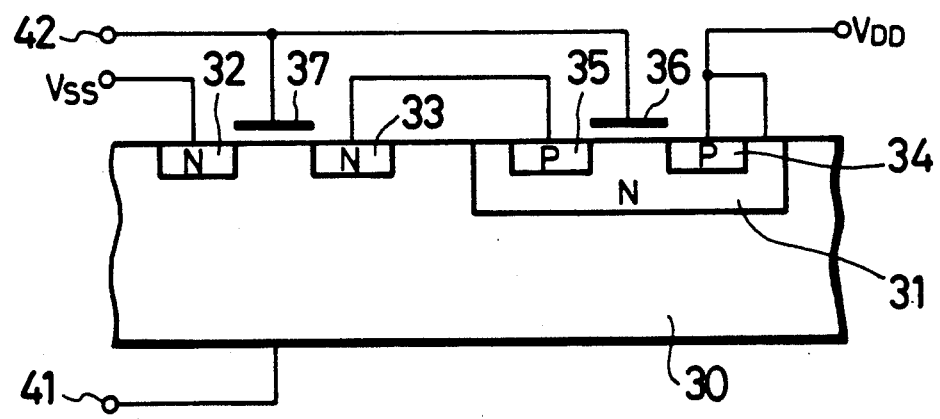
FIG. 6 is a schematic diagram illustrating an output buffer for use in a digital-to-analog converter according to a first embodiment of the present invention.

The present invention is herein applied to a digital-to-analog converter of a pulse width modulation system which is formed in a large scale integrated (LSI) circuit in which an output buffer is provided in the final stage as shown in FIG. 6.

A P-type substrate 30, in FIG. 6, has a predetermined circuit formed thereon, in which, a reference voltage signal is delivered through a reference voltage supply terminal 41 provided at a lead frame side. The voltage signal applied to the terminal 41 is produced from a variable voltage source (not shown) which can be adjusted, for example, in a range from $+0.5$ V to $-3.0$ V wherein the reference ground potential is 0 V.

An N-type well region 31 and N-type regions 32 and 33 are formed on the surface of the P-type substrate 30 and P-type regions 34 and 35 are formed within the N-type well region 31 as shown in FIG. 6. An electrode 36 is formed on the portion between the P-type regions 4 and 35 through an oxide film or the like, and an electrode 37 is similarly formed on the portion between the N-type regions 32 and 33 through an oxide film or the like. The electrodes 36 and 37 are coupled to a common terminal 42.

Figure 4:
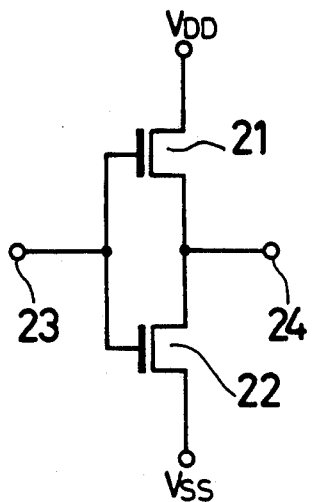
FIG. 4 is a schematic diagram of a complementary metal oxide semiconductdor (CMOS) inverter which forms the output buffer portion.
Figure 5:
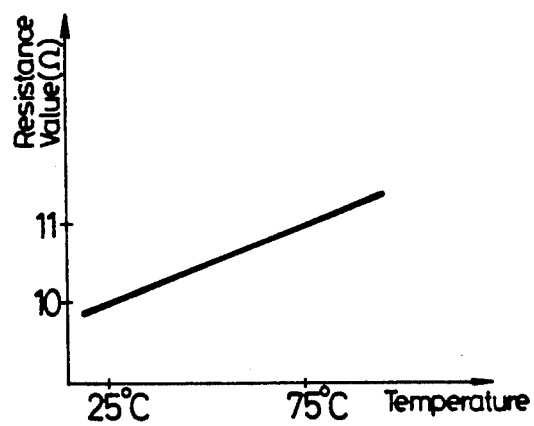
FIG. 5 is a diagram to which reference will be made in explaining the temperature characteristic of a resistor provided within an integrated circuit (IC)

In the above described arrangement, the P-type regions 34 and 35 within the well region 31 and the gate electrode 36 form a P-channel transistor, while the N-type regions 32 and 33 and the gate electrode 37 form an N-channel transistor. The P-channel transistor and the N-channel transistor constitute an output buffer similar to that described with reference to FIG. 4. The N-channel transistor is supplied with the substrate potential, determined as a back gate bias by the potential at the terminal 41. Voltage source terminal $V_{DD}$ is connected to the P-type region 34 and the well region 31, and voltage source terminal $V_{SS}$ is connected to the N-type region 32. Further, the P-type region 35 and the N-type region 33 are connected together.

An output circuit utilizing this output buffer will be described with reference to FIG. 7.

Figure 7:
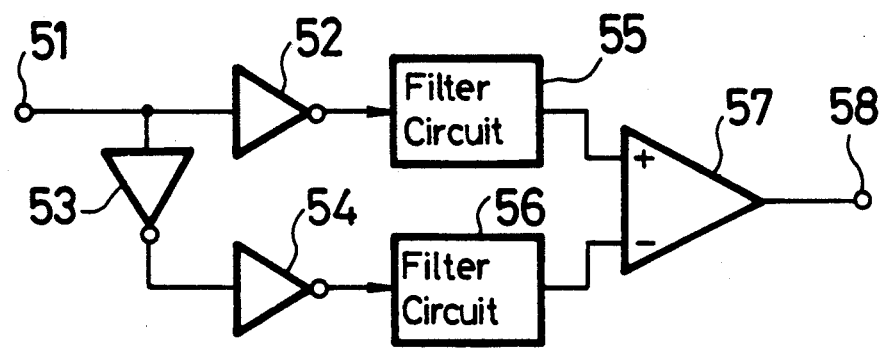
FIG. 7 is a block diagram illustrating an output buffer portion to which the inverter of the present invention is applied.

A pulse-width-modulated (PWM) wave from the D/A converting portion is supplied to a terminal 51 shown in FIG. 7. The terminal 51 is connected to a first output buffer portion 52 which is constructed as described with reference to FIG. 6. The terminal 51 is further connected through an inverter 53 to a second output buffer portion 54 which is also constructed as described with reference to FIG. 6. Thus, the first and second output buffer portions 52 and 54, respectively, derive PWM waves. Output signals from the first output buffer portion 52 and second output buffer portion 54 are respectively supplied through filter circuits 55 and 56 to the plus-side and minus-side input terminals of a subtracter 57. A subtracted output signal from subtractor 57 is coupled to an output terminal 58.

Figure 8A:
FIGS. 8A to 8C are waveform diagrams to which reference will be made in explaining an operation of the output buffer portion of FIG. 7.
Figure 8B:
Figure 8C:

The operation of the output circuit will now be explained with reference to FIGS. 8A to 8C.

The inverter 53 is coupled between the inputs of the first and second output buffer portions 52 and 54, respectively, and is adapted to invert a PWM wave supplied to buffer 54. Therefore, if a PWM wave derived from the first output buffer portion 52 is as shown in FIG. 8A, a PWM wave derived from the second output buffer portion 54 is inverted as shown in FIG. 8B. The PWM output waves from the first and second output buffer portions 52 and 54, respectively, are filtered and subtracted by the subtracter 57, so that a PWM wave results in which the peak values of both input PWM waves are added together, as shown in FIG. 8C. The resultant PWM wave from subtracter 57 is supplied to the output terminal 58.

Since the substrate potential is supplied to the N-channel transistor in the first and second output buffer portions 52 and 54, respectively, as the back gate bias as described above, it is possible to make the ON resistance values of the two transistors in the output buffer portions 52 and 54 equal to each other. More specifically, the substrate potential is adjusted by varying the voltage value of the signal supplied to terminal 41 within the aforementioned range, a threshold value Vth of the N-channel transistor is changed which varies the ON resistance value. Thus, the On resistance value of the N-channel transistor can be adjusted. By such adjustment of the ON resistance value of the N-channel transistor, it is possible to relatively adjust the ON resistance values of the two transistors, which form the output buffer circuit, so as to be equal to each other.

When the ON resistance values of the two transistors become equal, the temperature characteristics of the N-channel transistor and the P-channel transistor forming the respective output buffers also become equal to each other. Thus, regardless of an ambient temperature fluctuation, a PWM wave having a relatively low noise component is produced which thereby improves the S/N ratio of the output signal. As a result, when the output PWM wave is supplied to the low-pass filter and processed as an analog audio signal, it is possible to obtain an audio signal having a relatively high S/N ratio, for example, higher than 120 dB.

According to the above described embodiment of the present invention, the ON resistance values of the two transistors which form each output buffer circuit can be set equal to each other with relative ease regardless of ambient temperature fluctuations, so as to produce a PWM wave having a relatively low noise component. The grounding in the LSI circuit, which constitutes the D/A converter according to an embodiment of the present invention, will now be explained with reference to FIGS. 9–11.

Figure 9:
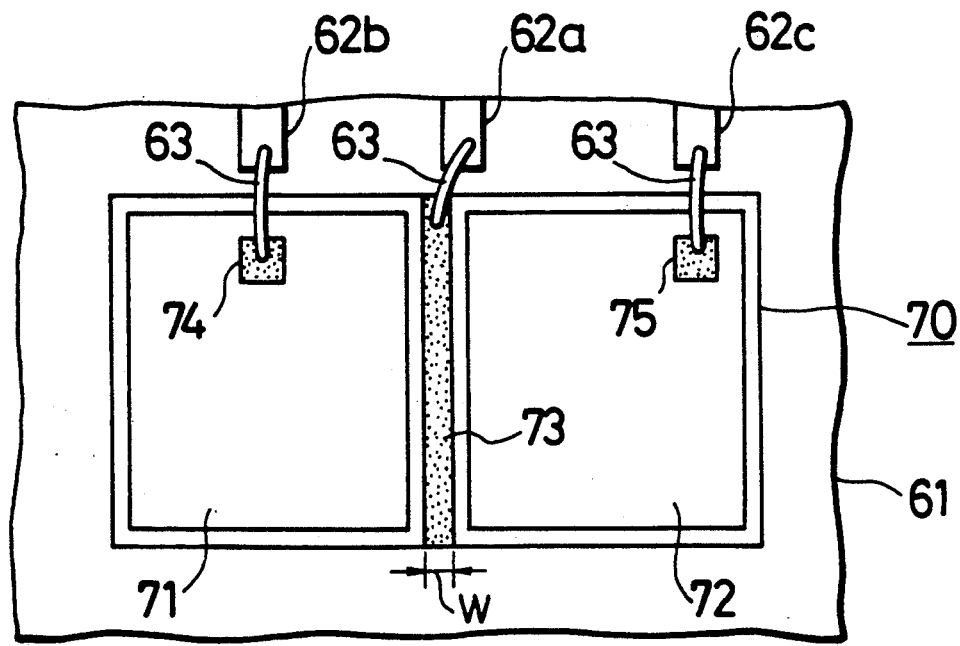
FIG. 9 is a top view illustrating a digital-to-analog converter according to a second embodiment of the present invention.

As shown in FIG. 9, an LSI circuit 70 is mounted on a lead frame 61 which is grounded. The LSI circuit 70 includes a digital signal processing portion 71, which converts a digital signal to an analog signal, and an analog signal processing portion 72 in a so-called one-chip fashion. The digital signal processing portion 71 includes the digital interpolation filter 2 and the D/A converter 3 shown in FIG. 1 or the like, whereas the analog signal processing portion 72 includes the output buffer circuit 4 shown in FIG. 1 which receives the analog signal converted by the digital signal processing portion 71. A separating ground electrode 73 is provided on the upper surface of the boundary portion between the two signal processing portions 71 and 72 and is continuously formed from one end to the other end having a width W of, for example, 50 micrometers. The separating ground electrode 73 is connected, by a lead wire 63, to a grounded-electrode portion 62a which is formed on the lead frame 61. Ground electrodes 74 and 75 are independently formed on the upper surfaces of the digital signal processing portion 71 and the analog signal processing portion 72, respectively, and are connected by respective lead wires 63 to grounded-electrode portions 62b and 62c, respectively, which are formed on the lead frame 61. Thus, the electrode portion 62a is independently formed on a ground portion of lead frame 61 and connected to the separating ground electrode 73, while the electrode portions 62b and 62c are independent of the electrode portion 62a and are respectively connected to the ground electrodes 74 and 75 of the two signal processing portions 71 and 72.

The inner structure of the LSI circuit 70 will now be explained with reference to FIG. 10.

Figure 10:
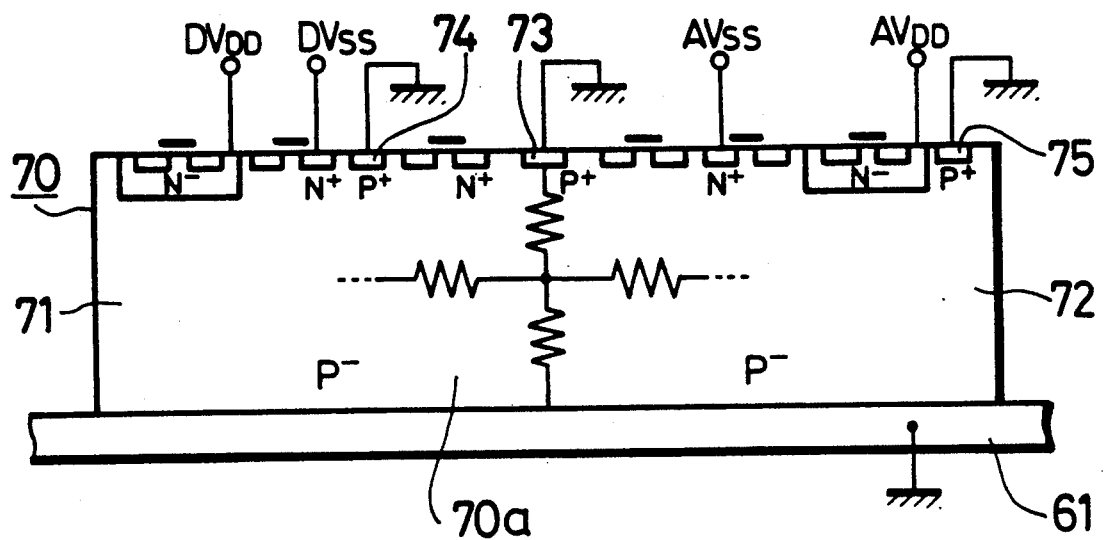
FIG. 10 is a diagram illustrating a section of FIG. 9.

As shown in FIG. 10, $N^+$ type regions and $N^-$ type well regions, which form predetermined switching elements, are formed on the surface of a $P^-$ type semiconductor substrate 70a and are divided into left and right portions to provide the digital signal processing portion 71 and the analog signal processing portion 72. The $P^{30}$ type separating ground electrode 73, which is formed of the same impurities as in the semiconductor substrate 70a, is formed on the boundary surface between the two signal processing portions 71 and 72. Ground electrodes 74 and 75 of the digital signal processing portion 71 and the analog signal processing portion 72, respectively, are provided as $P^+$ type regions. A voltage source terminal $DV_{DD}$, in the digital signal processing portion 71 is coupled to a predetermined $N^-$ type well region, whereas a second voltage source terminal $DV_{SS}$ is coupled to a predetermined $N^+$ type region. Similarly, a voltage source terminal $AV_{DD}$ in the analog signal processing portion 72 is connected to a predetermined $N^-$ type region, whereas a second voltage source terminal $AV_{SS}$ is connected to a predetermined $N^+$ type region.

Figure 11:
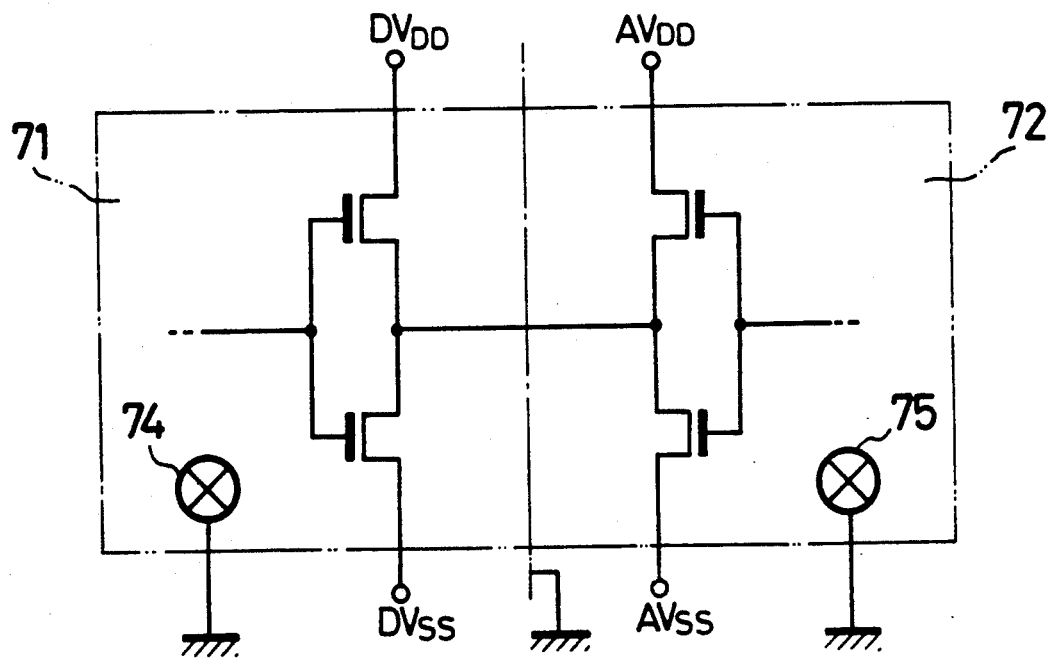
FIG. 11 is a diagram illustrating the structure of the embodiment shown in FIGS. 9 and 10.

Thus, as shown in FIG. 11, when the digital signal processing portion 71 and the analog signal processing portion 72 are isolated from each other by a ground potential located at the boundary portion, voltage source terminals $DV_{DD}$ or $AV_{DD}$ and $DV_{SS}$ or $AV_{SS}$ are respectively connected to each other, and the two signal processing portions 71 and 72 are respectively grounded. Further, circuit currents within the signal processing portions 71 and 72 are inhibited from flowing to the ground electrodes 74 and 75 in signal processing portions 71 and 72, respectively.

Consequently, separate power source signals are supplied to the two signal processing portions 71 and 72. As a result, a noise component generated from the digital signal processing portion 71, and in the form of pulse wave, is inhibited from being supplied to the analog signal processing portion 72 so as to prevent a jitter component from being produced in a signal derived from the analog signal processing portion 72. Accordingly, the analog audio signal obtained from converting the digital audio signal by the LSI circuit 70 has a relatively low noise level and, hence, an improved S/N ratio which results in an audio signal having improved sound quality.

Although the width W of the separating ground electrode 73 was hereinbefore described as being 50 micrometers, if possible, it may be preferable to have the width W larger than 50 micrometers.

According to an embodiment of the present invention, the digital signal processing portion and the analog signal processing portion are provided within the same integrated circuit chip and are prevented from interfering with each other, that is, signal processing is satisfactorily performed by the analog signal processing portion and is not affected by a noise component generated in the digital signal processing portion. Thus, an improved signal is obtained which the jitter component due to the noise component is avoided and the S/N ratio is improved.

Although illustrative embodiments of the invention have been described in detail herein with reference to the accompanying drawings, it is to be understood that the invention is not limited to those precise embodiments, and that various changes and modifications can be effected therein by one skilled in the art without departing from the spirit or scope of the invention as defined in the appended claims.

We claim as our invention:

1. In a digital-to analog converter for converting a received digital signal having N bits and a sampling frequency fs to an analog signal with an improved signal-to-noise ratio which comprises, digital interpolation filter means for receiving said digital signal and generating a modified digital signal having a number of bits less than N and a sampling frequency greater than fs, pulse width modulator means for receiving said modified digital signal and generating a pulse signal having pulse widths which correspond to said modified signal, output buffer means for receiving said pulse signal and having a complementary metal oxide semiconductor (CMOS) inverter circuit including P channel and N channel transistors having respective resistance values, and low-pass filter means for receiving an output signal from said output buffer means;

said digital interpolation filter means, said pulse width modulator means and said output buffer means are formed in an integrated circuit which includes a substrate and means for receiving a variable supplied voltage through said substrate, and said supplied voltage is adjusted so that, when the transistors are conductive, the resistance values of said P channel and N channel transistors are made equal to each other so as to improve the signal-to-noise ratio of the produced analog signal.

2. A digital-to-analog converter according to claim 1; wherein said output buffer means includes a first CMOS inverter circuit for generating a first output signal, a second CMOS inverter circuit and a third CMOS inverter circuit connected in series for generating a second output signal, and in which said low-pass filter means includes a first low-pass filter supplied with said first output signal for generating a first filtered output signal, a second low-pass filter supplied with said second output signal for generating a second filtered output signal and a differential circuit supplied with said first and second filtered output signals for generating a differential output signal.

3. A digital-to-analog converter according to claim 1; wherein said integrated circuit includes first grounding means for grounding a first circuit portion which includes said digital interpolation filter means and said pulse width modulator means, second grounding means for grounding a second circuit portion which includes said output buffer means, and third grounding means for grounding a boundary portion between said first and second circuit portions.

4. A digital-to-analog converter according to claim 1; wherein said integrated circuit is a large scale integrated circuit.

* * * * *